United States Patent
Wang et al.

(10) Patent No.: US 11,373,715 B1
(45) Date of Patent: Jun. 28, 2022

(54) POST OVER-ERASE CORRECTION METHOD WITH AUTO-ADJUSTING VERIFICATION AND LEAKAGE DEGREE DETECTION

(71) Applicant: ELITE SEMICONDUCTOR MICROELECTRONICS TECHNOLOGY INC., Hsinchu (TW)

(72) Inventors: Ming-Xun Wang, Hsinchu (TW); Chih-Hao Chen, Hsinchu (TW); Ji-Jr Luo, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 0 days.

(21) Appl. No.: 17/149,689

(22) Filed: Jan. 14, 2021

(51) Int. Cl.
*G11C 16/34* (2006.01)
*G11C 16/14* (2006.01)
*G11C 16/24* (2006.01)
*G11C 16/30* (2006.01)
*G11C 16/26* (2006.01)

(52) U.S. Cl.
CPC ............ *G11C 16/345* (2013.01); *G11C 16/14* (2013.01); *G11C 16/24* (2013.01); *G11C 16/26* (2013.01); *G11C 16/30* (2013.01); *G11C 16/3404* (2013.01)

(58) Field of Classification Search
CPC ...................................................... G11C 16/14
See application file for complete search history.

(56) References Cited

U.S. PATENT DOCUMENTS

| | | | |
|---|---|---|---|
| 5,335,198 A * | 8/1994 | Van Buskirk | G11C 16/3404 365/210.15 |
| 5,521,867 A * | 5/1996 | Chen | G11C 16/3404 365/185.24 |
| 7,251,165 B2 | 7/2007 | Taito et al. | |
| 8,995,200 B1 * | 3/2015 | Mu | G11C 7/14 365/185.21 |
| 9,653,173 B1 * | 5/2017 | Lo | G11C 16/14 |
| 2010/0039364 A1 * | 2/2010 | Lee | G09G 3/3696 345/100 |
| 2015/0270004 A1 * | 9/2015 | Tsai | G11C 16/16 365/185.11 |

* cited by examiner

*Primary Examiner* — Douglas King

(57) ABSTRACT

A post over-erase correction (POEC) method with an auto-adjusting verification mechanism and a leakage degree detection function detects $g_m$ degradation or leakage degree of flash cells before or after entering the POEC process. When a preset condition is satisfied, the auto-adjusting verification mechanism of the POEC is switched on to further reduce leakage current. After cycling, the POEC repairs Vt of over-erased cells to a higher level to solve leakage issues. The erase shot count increases due to slower erase speeds after cycling. Therefore, the cycling degree of flash cells is detected by observing the shot number that the erase operation used. When the leakage phenomenon becomes serious, the bit line (BL) leakage current, amount of repaired BLs, and over-erase correction (OEC) shot number will increase during the OEC procedure. Therefore, the leakage degree of flash cells can be detected by inspecting the above data.

7 Claims, 14 Drawing Sheets

POST OVER-ERASE CORRECTION METHOD WITH AUTO-ADJUSTING VERIFICATION AND LEAKAGE DEGREE DETECTION

BACKGROUND OF THE INVENTION

1. Field of the Invention

The present disclosure relates to post over-erase correction, and in particular to a post over-erase correction method with an auto-adjusting verification mechanism and a leakage degree detection function.

2. Description of the Related Art

Erasing and writing procedures in flash memory, by applying voltage, cause stress to the semiconductor. As a result, the transconductance characteristics, "$g_m$", of memory cells is degraded and the memory cell's ON current decreases while the OFF current increases.

This $g_m$ degradation causes damaging effects on the semiconductor flash memory. One effect is an increase in erasing time accompanied with a decrease of the ON current of the memory cell. Another harmful effect is a decrease of read margin accompanied with an increase of the OFF leak current of unselected memory cells.

As the ON current decreases, erasing time increases because low ON current of the memory cell during erasing verification is input to a sense amplifier thus more erasing shots are required for lowering the threshold voltage of the memory cell. As the OFF leak current increases, the OFF leak current makes it difficult to judge a "0" of the read data, causing a decrease of the read margin.

The conventional flash cell erase algorithm can be divided into four steps. Initially, flash cells are pre-programmed to a programmed state. Then, an erase operation is performed to change the programmed cells to an erased state. After that, over-erased cells are repaired by executing over-erase correction (OEC) and post over-erase correction (POEC) processes. The operation of over-erase correction (OEC) is executed on a plurality of bit-lines (for example, 8 bit-lines or a multiple of 8) with applying a lower voltage on all word-lines (for example, 0V~2V). The operation of post over-erase correction (POEC) is executed on a plurality of bits (for example, 8 bits or a multiple of 8) with applying a higher voltage on a selected-word-line, for example, 2V~4V and applying zero or negative voltage on all the unselected-word-lines, for example, 0V~-2V. After OEC is executed, the threshold voltage of flash cell is around 0V~1V. After POEC is executed, the threshold voltage of flash cell is programmed to a higher voltage ex: 1V~2V. The purpose of POEC is to reduce OFF leak current further after executing OEC especially for flash cell scaling down.

Refer to FIG. 1, which is a flowchart illustrating an over-erase correction and post over-erase correction method of the prior art. The conventional method 10 begins by pre-programming the flash cells in Step 20. In Step 30 the flash cells are erased. An over-erase correction process is performed in Step 40 and a post over-erase correction process is performed in Step 50.

Refer to FIG. 2, which is a drawing illustrating a comparing circuit of the prior art. During each step of the method shown in FIG. 1, the states of flash cells are verified by comparing the cell current with a reference current, as shown in FIG. 2.

Refer to FIG. 3, which is a graph illustrating $g_m$ degradation of the prior art. The $g_m$ degradation of flash cells occurs when program and erase operations are performed repeatedly, which is known as a "cycling issue". When the flash cell current is lower than the POEC reference current (Ipoecv), which represents POEC Verification Pass and no more POEC programming shots will be executed. The un-cycled-cell shows no OFF leak current at 0V. However, the cycled-cell still contributes OFF leak current at 0V due to the gm degradation, as shown in FIG. 3. As a result, the cycled-cell will cause leakage issues during other operations of the flash cells, for example, the page program time ($t_{PP}$) will increase or the read "0" margin will decrease as mentioned previously.

Before cycling, if the POEC reference current (Ipoecv) is trimmed to a lower level for repairing threshold voltage (Vt) of over-erased cells to a higher level, the POEC time will increase, causing unacceptable erase times. For reference the typical block erase time is 300 ms. Moreover, the risk of over soft-programming also increases if the reference current of POEC before cycling is set to a lower value. The un-cycled cell shows faster POEC programming speed than the cycled cell. The phenomena of over soft-programming means that the threshold voltage after POEC programming is greater than erasing verification Vt, which will cause read "1" margin to decrease.

Therefore, to overcome the disadvantages of the prior art, there is need for an improved post over-erase correction method with an auto-adjusting verification mechanism and a leakage degree detection function.

BRIEF SUMMARY OF THE INVENTION

An objective of the present disclosure is to provide a post over-erase correction (POEC) method with adjustable verification.

The present invention detects $g_m$ degradation or leakage degree of flash cells before entering the POEC process. Only when a preset condition is satisfied, the verification mechanism of the POEC is switched on to further reduce leakage current. Therefore, the erase time is reasonable and the risk of over soft-programming is low. After cycling, the POEC repairs Vt of over-erased cells to a higher level to solve leakage issues. Such solutions comprise obtaining a reasonable read margin and $t_{PP}$ after cycling while the increased erase time is acceptable since the allowable block erase time is referred to the maximum block erase time in the specification of flash memory, for example, 2 seconds. Moreover, the risk of over soft-programming due to degradation of programmability after cycling is also reduced. Furthermore, when a preset condition is satisfied, the programming voltage (both WL and BL voltage) of the POEC can be changed to a lower level to further reduce the risk of over soft-programming.

There are several methods to determine the switching condition of the POEC mechanism. One method is as follows. The erase shot count increases due to slower erase speeds after cycling. Therefore, the cycling degree of flash cells can be detected by observing the shot number that the erase operation used. The second method is as follows. When the leakage phenomenon becomes serious, the amount of repaired BLs and the over-erase correction (OEC) shot number will increase during the OEC procedure. Therefore, the leakage degree of flash cells can be detected by inspecting the above data. The third method is to detect the bit line (BL) leakage current directly to determine the switching condition of the POEC mechanism.

The fourth method is to detect $g_m$ degradation of flash cells after the first POEC mechanism is finished. If $g_m$ degradation is detected, the second POEC mechanism is performed to further repair the Vt of flash cells to a higher level. At first, POEC1 (post over-erase correction mechanism 1) repairs cells with Ipoecv1. When $g_m$ degradation occurs, POEC2 (post over-erase correction mechanism 2) repairs cells with different methods. For example, Iref=Ipoecv2 and WL=POEC_verify or Iref=I $g_m$-test and WL=$g_m$_verify. The programming voltage (both WL and BL voltage) of POEC2 can be adjusted for preventing over soft-programming.

Different combinations of the method of the present invention mentioned above are used to determine the switching condition of the POEC. For example, the following conditions are used in various embodiments. A first method is to consider only one of the erase shot number, the repaired BL amount during OEC, the OEC shot number, the BL leakage current, or $g_m$ degradation. A second method is to consider both the erase shot number and $g_m$ degradation. A third method is to consider both the repaired BL amount during OEC and $g_m$ degradation. A fourth method is to consider both the OEC shot number and $g_m$ degradation.

There are many methods to change the threshold voltage of flash cells to a higher level. Generally, several common methods in flash circuit design technology are used to change the verification mechanism of the POEC. One method comprises, since the reference current is produced by multiple sets of reference cells or constant current, once the switching condition is reached, the number of reference cells or constant current is reduced to lower the reference current. Another method comprises, since the reference current is supplied by the reference cells, the reference current can be changed by selecting other reference cells with a lower cell current. Another method comprises, since the reference current is established by reference cells, the current comparison mechanism can be changed by modulating the word line (WL) voltage or the reference current. When the preset leakage-degree is detected, the comparison condition is changed to repair the threshold voltage of over-erased cells to a higher level with or without adjusting the programming voltage of POEC.

In an embodiment, the present invention comprises a post over-erase correction method with an auto-adjusting verification mechanism and a leakage degree detection function. The method comprises pre-programming a plurality of flash cells; erasing the plurality of flash cells; performing over-erase correction; determining a target degree to obtain a switch condition result; and turning on the auto-adjusting verification mechanism and performing post over-erase correction based upon the switch condition result. In the method, a reference current is produced by multiple sets of reference cells or constant current, and turning on the auto-adjusting verification mechanism reduces an amount of reference cells or constant current to lower reference current.

In an embodiment, turning on the auto-adjusting verification mechanism and performing post over-erase correction repairs threshold voltage of over-erased cells to a higher level with or without adjusting the programming voltage of POEC.

The post over-erase correction method with an auto-adjusting verification mechanism and a leakage degree detection function comprises recording an erase shot number for each erase procedure. Then the erase shot number is compared with a target cycling-degree to confirm that the erase shot number has reached a target cycling-degree. The switch condition result is a switch on condition when the erase shot number has reached the target cycling-degree and the switch on condition turns on the auto-adjusting verification mechanism and the post over-erase correction is performed.

In an embodiment, the post over-erase correction method with an auto-adjusting verification mechanism and a leakage degree detection function of the present invention comprises detecting a BL leakage current or recording a repaired bit line amount, and an over-erase correction shot number for each over-erase correction procedure. Then the bit line leakage current, the repaired bit line amount, and the over-erase correction shot number are compared with a target leakage-degree to confirm that the bit line leakage current, the repaired bit line amount, and the over-erase correction shot number have reached a target leakage-degree. The switch condition result is a switch on condition when the bit line leakage current, the repaired bit line amount, and the over-erase correction shot number have reached the target leakage-degree and the switch on condition turns on the auto-adjusting verification mechanism and the post over-erase correction is performed.

In an embodiment of the present invention, the post over-erase correction method with an auto-adjusting verification mechanism and a leakage degree detection function determines the target degree to obtain a switch condition result by considering only one of either the erase shot number, the repaired bit line amount during over-erase correction, the over-erase correction shot number, the BL leakage current or $g_m$ degradation. In another embodiment, the method determines the target degree to obtain a switch condition result by considering both the erase shot number and $g_m$ degradation. In another embodiment, the method determines the target degree to obtain a switch condition result by considering both repaired bit line amount during over-erase correction and $g_m$ degradation. In another embodiment, the method determines the target degree to obtain a switch condition result by considering both the over-erase correction shot number and $g_m$ degradation.

In an embodiment, the present invention comprises a post over-erase correction method. The method comprises pre-programming a plurality of flash cells; erasing the plurality of flash cells; performing over-erase correction on the plurality of flash cells; performing post over-erase correction on the plurality of flash cells; detecting $g_m$ degradation; and performing post over-erase correction with auto-adjusting verification mechanism based upon detected $g_m$ degradation. In the method, reference current is produced by multiple sets of reference cells or constant current and performing the post over-erase correction with auto-adjusting verification mechanism comprises reducing an amount of reference cells or constant current to lower reference current. In an embodiment, performing post over-erase correction with auto-adjusting verification mechanism repairs threshold voltage of over-erased cells to a higher level with or without adjusting the programming voltage of POEC.

In an embodiment, the post over-erase correction method further comprises recording an erase shot number for each erase procedure and comparing the erase shot number with a target cycling-degree to confirm that the erase shot number has reached a target cycling-degree. The post over-erase correction with auto-adjusting verification mechanism is performed when the erase shot number has reached the target cycling-degree and $g_m$ degradation is detected.

In an embodiment, the post over-erase correction method further comprises detecting a BL leakage current or recording a repaired bit line amount, and an over-erase correction shot number for each over-erase correction procedure. Then the bit line leakage current, the repaired bit line amount, and the over-erase correction shot number are compared with a target leakage-degree to confirm that the bit line leakage current, the repaired bit line amount, and the over-erase correction shot number have reached the target leakage-degree. The post over-erase correction with auto-adjusting verification mechanism is performed when the bit line leakage current, the repaired bit line amount, and the over-erase correction shot number have reached the target leakage-degree and $g_m$ degradation is detected.

In an embodiment, the post over-erase correction with auto-adjusting verification mechanism is performed when a repaired bit line amount has reached the target leakage-degree and $g_m$ degradation is detected. In an embodiment, the post over-erase correction with auto-adjusting verification mechanism is performed when the over-erase correction shot number has reached a target leakage-degree and $g_m$ degradation is detected.

In an embodiment, the present invention comprises a post over-erase correction method with an auto-adjusting verification mechanism and a leakage degree detection function. The method comprises pre-programming a plurality of flash cells; erasing the plurality of flash cells; recording an erase shot number for each erase procedure; performing over-erase correction; comparing the erase shot number with a target cycling-degree; and turning on the auto-adjusting verification mechanism and performing post over-erase correction based upon the comparison of the erase shot number with the target cycling-degree. In an embodiment, the auto-adjusting verification mechanism is turned on and post over-erase correction is performed when the erase shot number reaches the target cycling-degree. A reference current is produced by multiple sets of reference cells or constant current, and performing post over-erase correction with auto-adjusting verification mechanism comprises reducing an amount of reference cells or constant current to lower reference current. In an embodiment, turning on the auto-adjusting verification mechanism repairs threshold voltage of over-erased cells to a higher level with or without adjusting the programming voltage of POEC.

In an embodiment, the post over-erase correction method with an auto-adjusting verification mechanism and a leakage degree detection function comprises detecting a BL leakage current or recording a repaired bit line amount, and an over-erase correction shot number for each over-erase correction procedure and comparing the bit line leakage current, the repaired bit line amount, and the over-erase correction shot number with a target leakage-degree to confirm that the bit line leakage current, the repaired bit line amount, and the over-erase correction shot number have reached a target leakage-degree. The auto-adjusting verification mechanism is turned on and the post over-erase correction is performed when the erase shot number reaches the target cycling-degree and the bit line leakage current, the repaired bit line amount, and the over-erase correction shot number have reached the target leakage-degree. The method further comprises detecting $g_m$ degradation. The auto-adjusting verification mechanism is turned on and the post over-erase correction is performed when the erase shot number reaches the target cycling-degree and $g_m$ degradation is detected.

In an embodiment, the present invention comprises a post over-erase correction method. The method comprises detecting $g_m$ degradation of flash cells; detecting leakage-degree of the flash cells; and performing post over-erase correction on the flash cells based on detected $g_m$ degradation or detected leakage-degree. The post over-erase correction with auto-adjusting verification mechanism is performed when $g_m$ degradation is detected. In an embodiment, the post over-erase correction is performed when leakage-degree reaches a target leakage-degree. In an embodiment, the post over-erase correction with auto-adjusting verification mechanism is performed when a bit line leakage current, a repaired bit line amount, or an over-erase correction shot number reaches a target leakage-degree. In an embodiment, the post over-erase correction comprises adjusting an amount of reference cells or constant current to adjust the reference current. In an embodiment, the reference current is produced by multiple sets of reference cells or constant current and performing post over-erase correction comprises reducing the amount of reference cells or constant current to lower reference current. In an embodiment, performing post over-erase correction repairs threshold voltage of over-erased cells to a higher level with or without adjusting the programming voltage of POEC.

In an embodiment, the post over-erase correction method comprises comparing a bit line leakage current, a repaired bit line amount, and an over-erase correction shot number with a target leakage-degree to confirm that the bit line leakage current, the repaired bit line amount, and the over-erase correction shot number have reached a target leakage-degree. In an embodiment, the post over-erase correction with auto-adjusting verification mechanism is performed when the erase shot number reaches a target cycling-degree and $g_m$ degradation is detected. In an embodiment, the post over-erase correction with auto-adjusting verification mechanism is performed when the erase shot number reaches a target cycling-degree and detected leakage-degree reaches a target leakage-degree.

DETAILED DESCRIPTION OF THE INVENTION

To facilitate understanding of the object, characteristics and effects of this present disclosure, embodiments together with the attached drawings for the detailed description of the present disclosure are provided.

Figure 1:
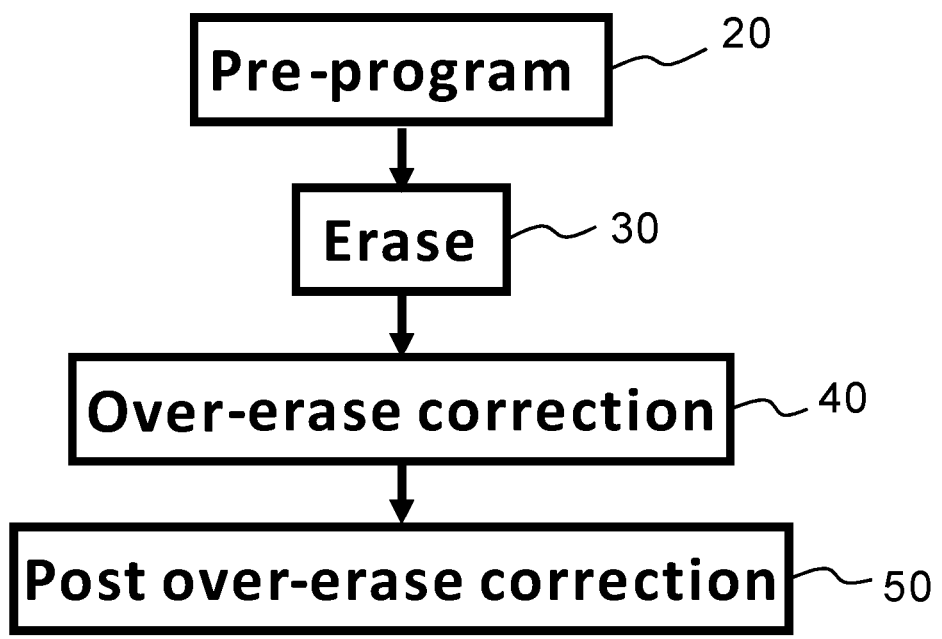
FIG. 1 is a flowchart illustrating an over-erase correction and post over-erase correction method of the prior art.
Figure 2:
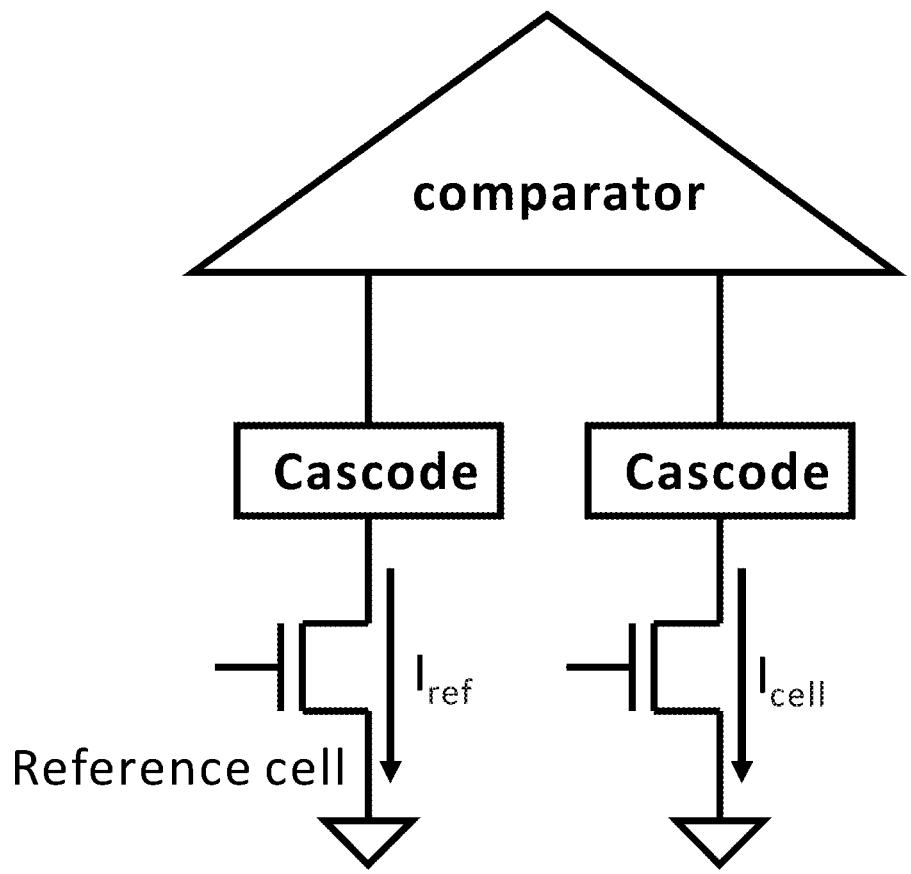
FIG. 2 is a drawing illustrating of a circuit comparing cell current and reference current to verify the state of flash cells of the prior art.
Figure 3:
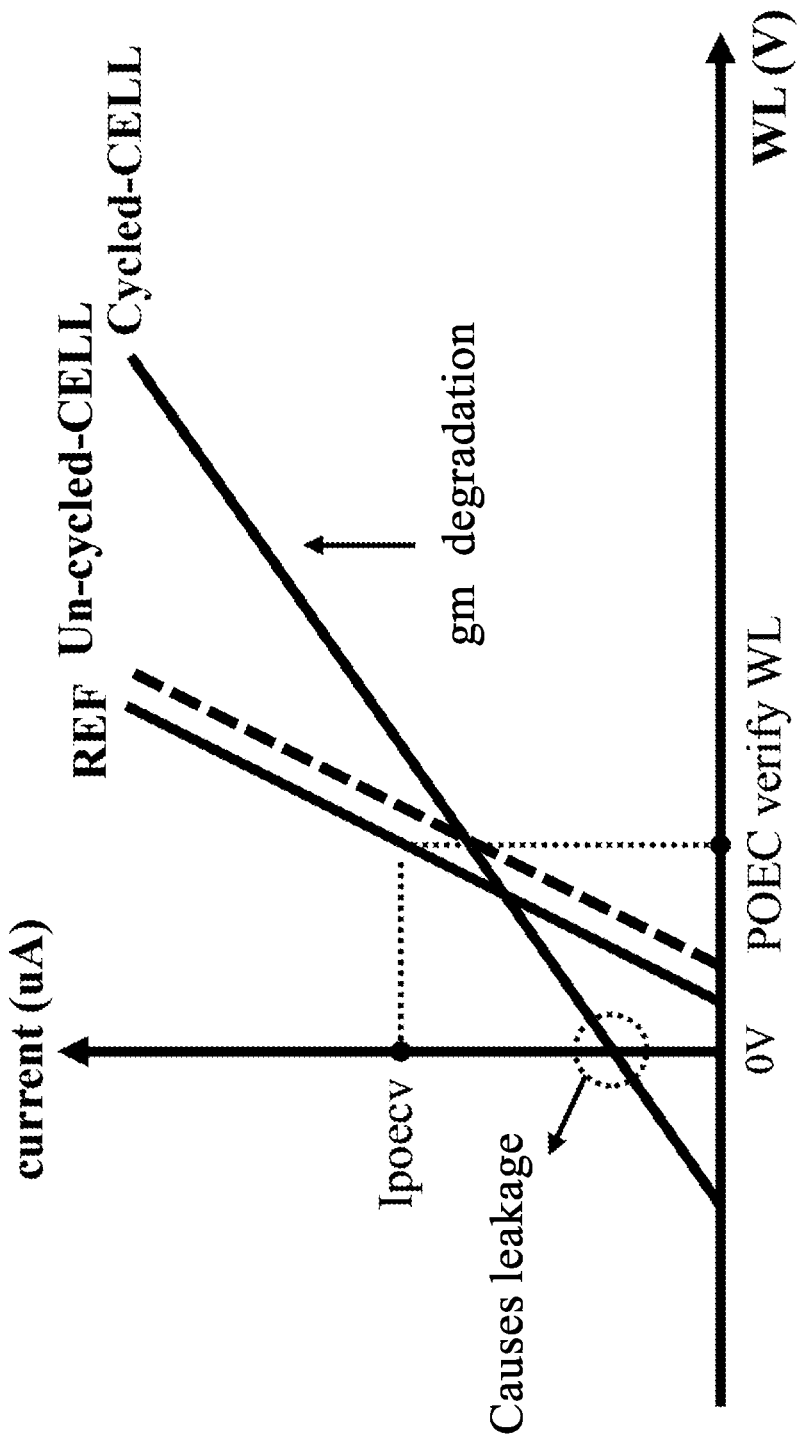
FIG. 3 is a graph illustrating $g_m$ degradation of the prior art.
Figure 4A:
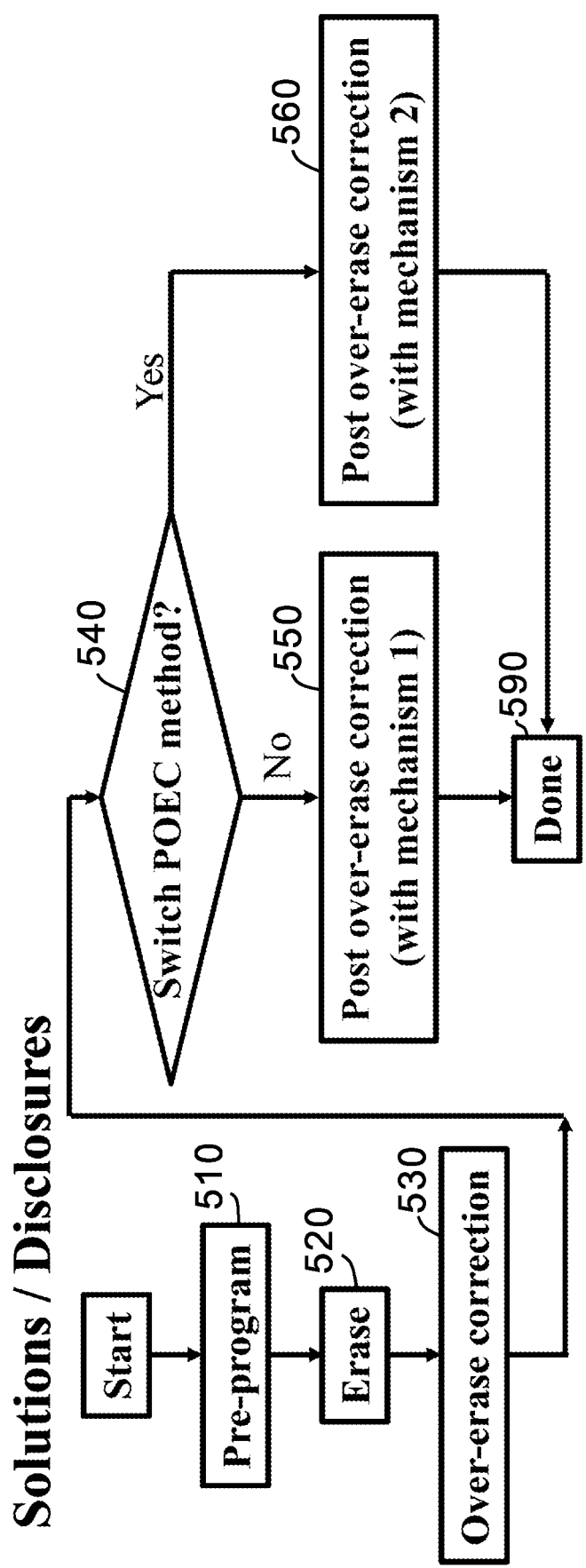
FIG. 4A is a drawing illustrating two post over-erase correction method with adjustable verification mechanism according to an embodiment of the present invention.
Figure 4B:
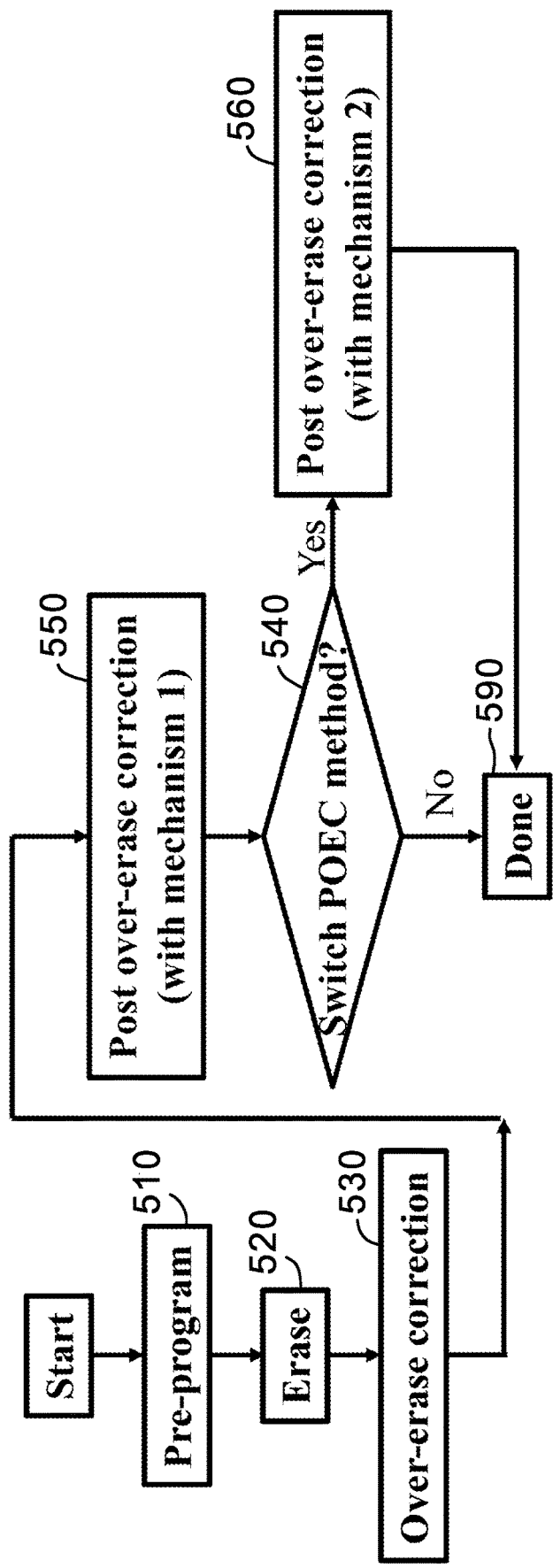
FIG. 4B is a drawing illustrating two post over-erase correction method with adjustable verification mechanism according to an embodiment of the present invention.

Refer to FIG. 4A and FIG. 4B, which are drawings illustrating two post over-erase correction methods with adjustable verification mechanisms according to embodiments of the present invention. The present invention detects $g_m$ degradation or leakage degree of flash cells before or after the POEC1 step. When a preset condition is satisfied, the verification mechanism of the POEC2 is switched on to further reduce leakage current. Since the un-cycled flash cells suffer less $g_m$ degradation and leakage degree, the probability of switching on of POEC2 is low at initial state. Therefore, the initial erase time is reasonable.

After cycling, the POEC2 repairs Vt of over-erased cells to a higher level for solving leakage issues. Such solutions are obtaining a reasonable read margin and $t_{PP}$ after cycling while the increased erase time is acceptable since the allowable block erase time is longer after cycling. Moreover, the risk of over soft-programming due to degradation of programmability after cycling is also reduced. The programming voltage of the POEC can be changed to a lower level to further reduce the risk of over soft-programming.

The POEC verification method 500 begins by pre-programming the flash cells in Step 510. In Step 520 the flash cells are erased and over-erase correction is performed in Step 530.

In Step 540, determination is made on whether or not to switch on the POEC method with adjustable verification mechanism (POEC2). If it is determined to switch on the POEC method, perform post over-erase correction using the adjustable verification mechanism in Step 560 and then end in Step 590. If it is determined to not switch on the POEC method with adjustable verification, perform post over-erase correction in Step 550 and then end in Step 590.

There are several methods to determine the switch condition of the POEC mechanism.

Figure 5:
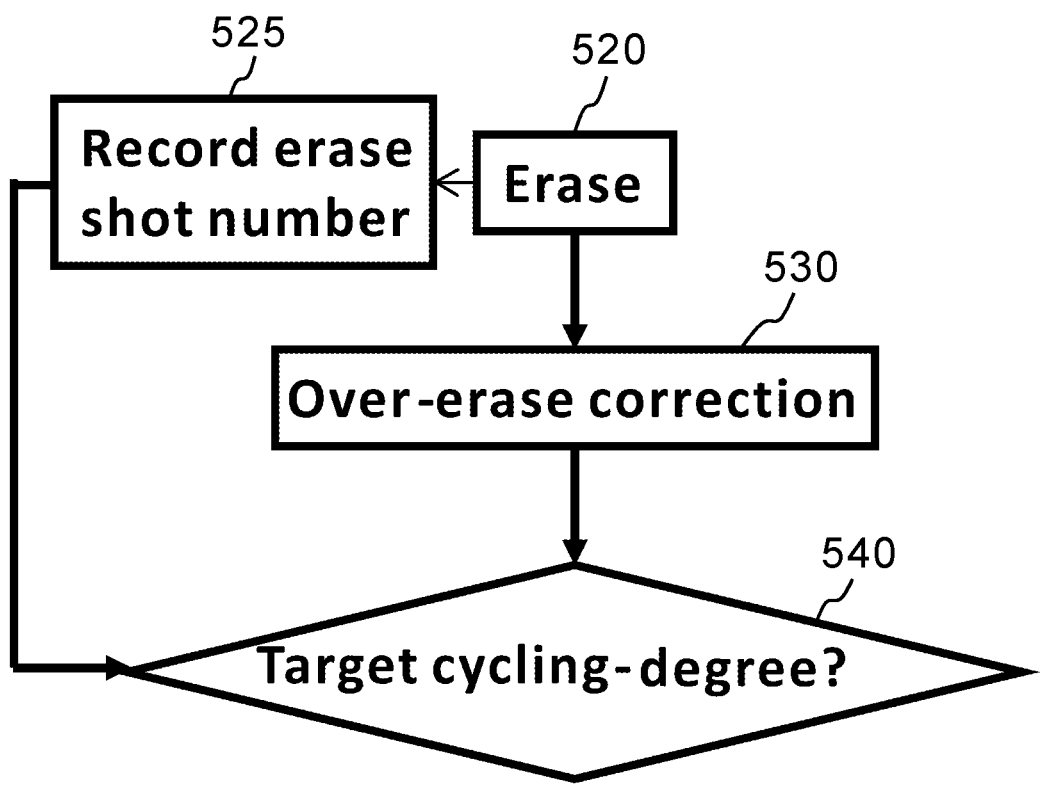
FIG. 5 is a flowchart illustrating a method of determining the switching condition of the post over-erase correction mechanism according to an embodiment of the present invention.

Refer to FIG. 5, which is a flowchart illustrating a method of determining the switching condition of the post over-erase correction mechanism according to an embodiment of the present invention The embodiment of the present invention illustrated in FIG. 5 is one method to detect leakage-degree of flash cells. The erase shot number increases due to slower erase speeds after cycling. Therefore, the cycling-degree of flash cells can be detected by observing the shot number that the erase operation used.

In Step 520, the flash cells are erased and over-erase correction is performed in Step 530. For each erase operation the erase shot number is recorded in Step 525. In Step 540, the erase shot number is used to determine whether or not the erase shot number has reached a target cycling-degree.

If the erase shot number has reached the target cycling-degree, the POEC method with adjustable verification mechanism is switched on and post over-erase correction with the adjustable verification mechanism (Step 560 of FIG. 4A and FIG. 4B) is performed.

If the erase shot number has not reached the target cycling-degree, the POEC method with adjustable verification mechanism is not switched on and post over-erase correction (Step 550 of FIG. 4A) is performed. Or the method is done in Step 590 in FIG. 4B.

Figure 6A:
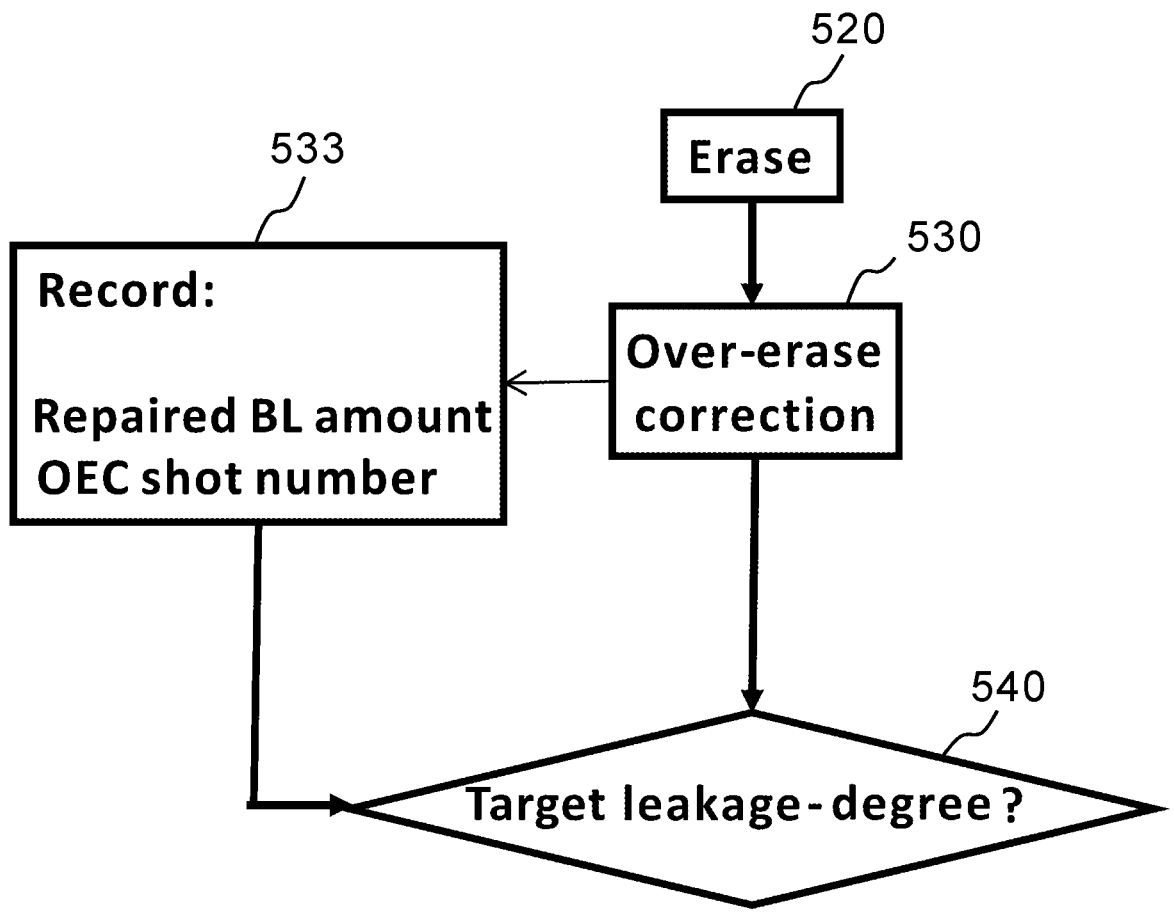
FIG. 6A is a flowchart illustrating methods of determining the switching condition of the post over-erase correction mechanism according to an embodiment of the present invention.
Figure 6B:
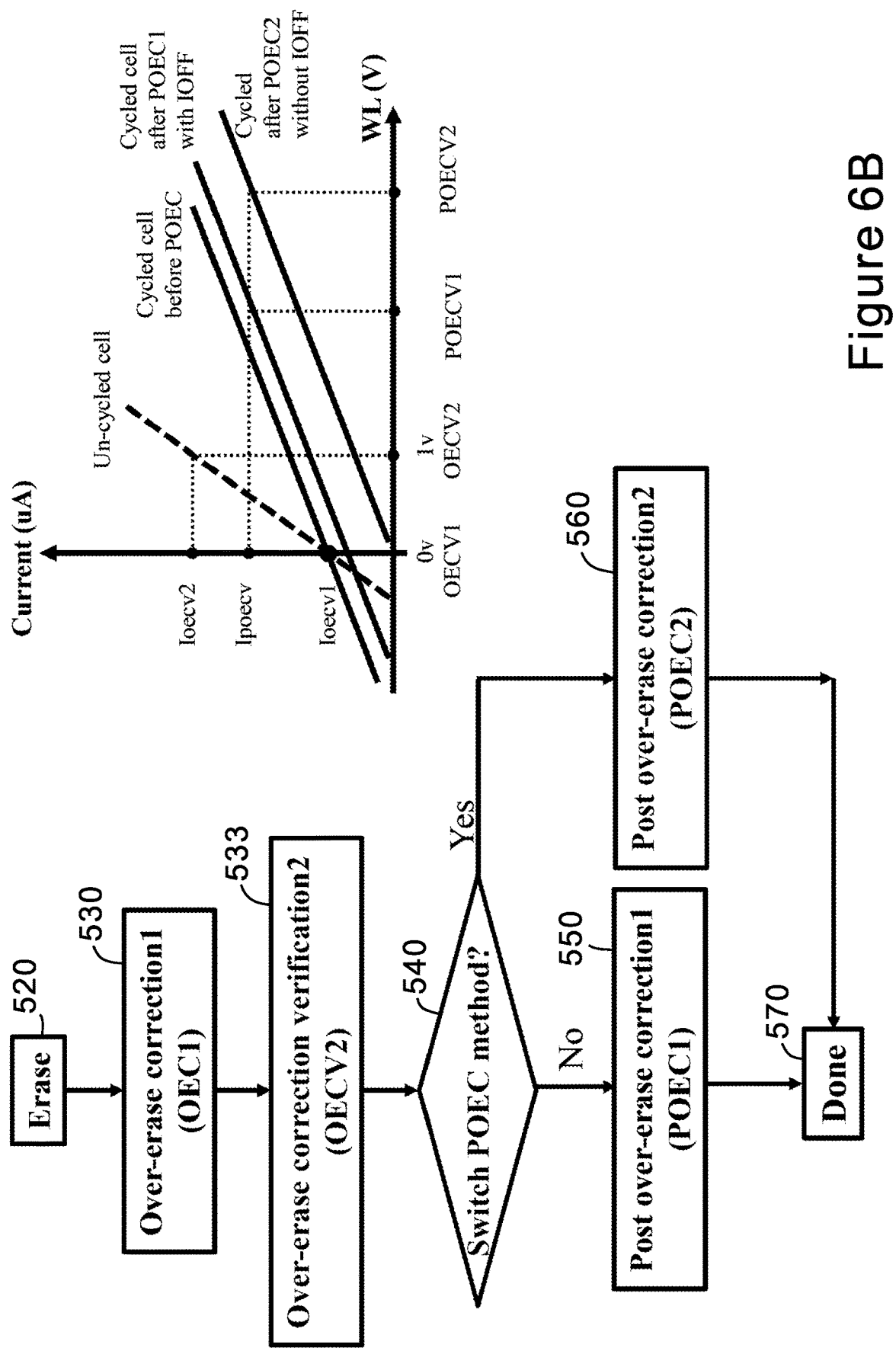
FIG. 6B is a flowchart illustrating methods of determining the switching condition of the post over-erase correction mechanism according to an embodiment of the present invention.
Figure 6C:
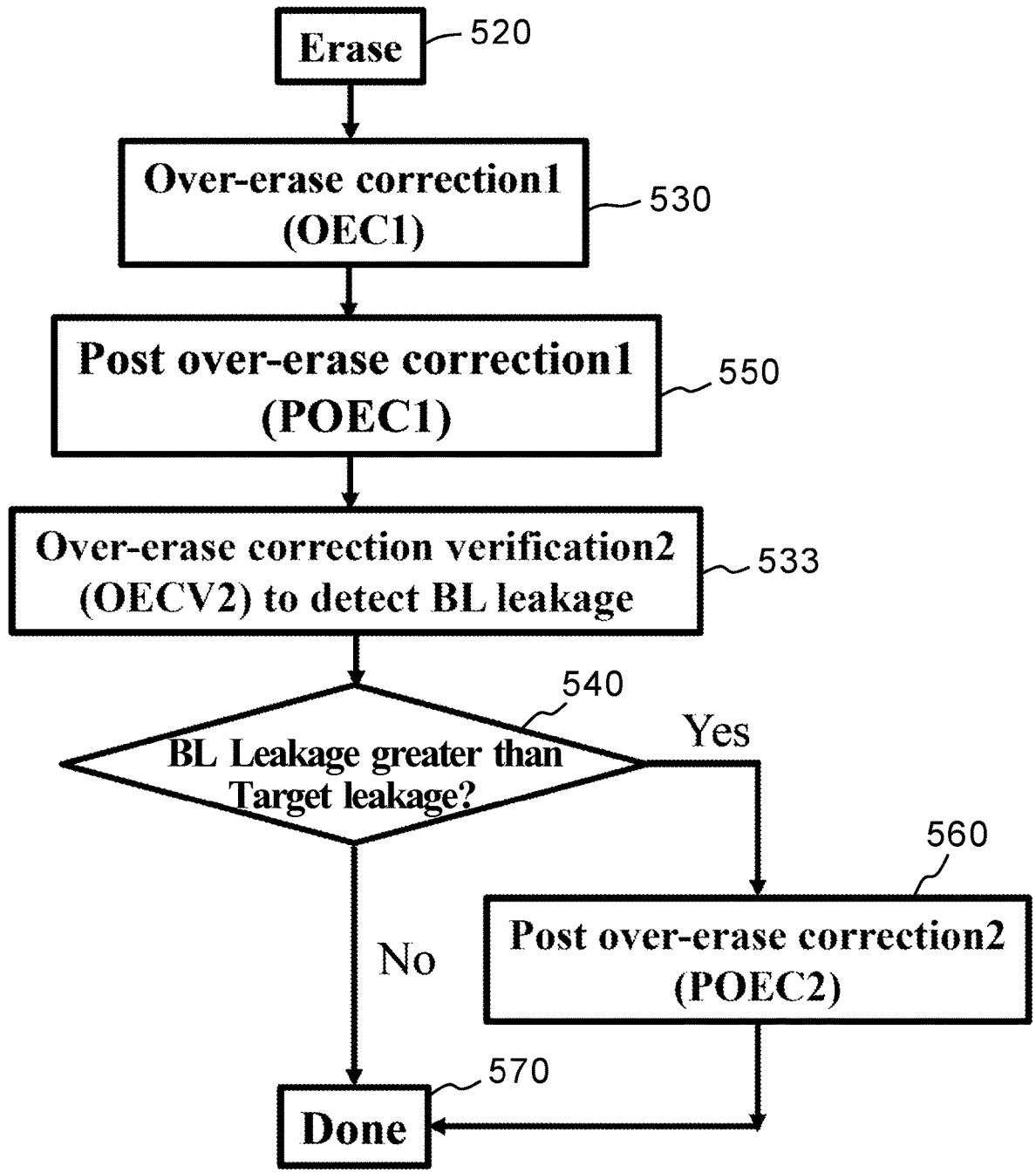
FIG. 6C is a flowchart illustrating methods of determining the switching condition of the post over-erase correction mechanism according to an embodiment of the present invention.

Refer to FIG. 6A, FIG. 6B and FIG. 6C, which is are flowcharts illustrating methods of determining the switching condition of the post over-erase correction mechanism according to an embodiment of the present invention.

The embodiment of the present invention illustrated in FIG. 6A is for another method of detecting leakage-degree of flash cells. When the leakage phenomenon becomes serious, the amount of repaired BLs, and the OEC shot number will increase during the OEC operation. Therefore, the leakage-degree of flash cells can be detected by inspecting the above data.

In Step 520 the flash cells are erased and over-erase correction is performed in Step 530. For each over-erase correction operation, the amount of repaired BLs and the OEC shot number are recorded in Step 533. In Step 540 the amount of repaired BLs and the OEC shot number are used to determine whether or not the amount of repaired BLs and the OEC shot number have reached a target cycling-degree.

If the amount of repaired BLs, and the OEC shot number have reached a target cycling-degree, the POEC method with adjustable verification mechanism is switched on and post over-erase correction with adjustable verification mechanism (Step 560 of FIG. 4A and FIG. 4B) is performed.

If the amount of repaired BLs and the OEC shot number have not reached the target cycling-degree, the POEC method with adjustable verification mechanism is not switched on and post over-erase correction (Step 550 of FIG. 4A) is performed. Or the method is done in Step 590 in FIG. 4B.

The embodiment of the present invention illustrated in FIG. 6B and FIG. 6C are two methods for detecting leakage current directly by OEC verification.

The embodiment of the present invention illustrated in FIG. 6B is for another method of detecting leakage-degree of flash cells. When $g_m$ degradation after cycling the leakage phenomenon becomes serious, the BL leakage current after POEC1 whether or not affect the OFF current can be checked by OEC verification with different conditions of OEC verification. For example, WL voltage=1V and Iref=Ioec2.

In Step 520 the flash cells are erased, over-erase correction1 (OEC1) is performed in Step 530. In Step 533 over-erase correction verification2 (OECV2) is performed to checked the BL leakage after OEC1 whether it causes the OFF current. Different verified conditions are used for OEC1 and OECV2. For example, the verification WL voltage of OEC1 is 0V and IREF=Ioecv1=4 uA; the verification WL voltage of OEC2 is 1V and IREF=Ioecv2<14 uA. When OEC1 is performed and verification passed in Step 530, if the result of OECV2 verification is pass in Step 533, i.e. the cell current is less than Ioecv2, which means this bit line will contribute to the OFF current after POEC1 is performed or means $g_m$ degradation. It is required to switch on the POEC method with adjustable verification mechanism (POEC2). If the result of OECV2 verification is fail in Step 533, i.e. the cell current is greater than Ioecv2, which means this bit line will not contribute to the OFF current after POEC1 is performed or means gm normal. It is not required to switch on the POEC method with adjustable verification mechanism (POEC2). In Step 540, determination is made on whether or not to switch on the POEC method with adjustable verification mechanism (POEC2). If it is determined to switch on the POEC method, perform post over-erase correction using the adjustable verification mechanism in Step 560 and then end in Step 570. If it is determined to not switch on the POEC method with adjustable verification, perform post over-erase correction in Step 550 and then end in Step 570.

The embodiment of the present invention illustrated in FIG. 6C is for another method of detecting leakage-degree of flash cells. When the leakage phenomenon becomes serious, the BL leakage current can be detected directly. Therefore, the BL leakage current can be detected by using the OEC verification with a well-chosen condition of verification.

In Step 520 the flash cells are erased, over-erase correction1 (OEC1) is performed in Step 530 and post over-eras correction1 (POEC1) is performed in Step 550. In Step 533 over-erase correction verification2 (OECV2) is performed to detect the BL leakage. In Step 540 check whether or not the BL leakage current is greater than a target leakage. Different verified conditions are used for OEC1 and OECV2. For example, the verification WL voltage of OEC1 is 0V~0.5V and IREF=Ioecv1=4 uA. The verification WL voltage of OEC2 is 0.3V~1V and the IREF=Ioecv1=4 uA.

If the BL leakage current is greater than a target leakage, the POEC method with adjustable verification mechanism is switched on and post over-erase correction with adjustable verification mechanism (Step 560) is performed.

If the BL leakage current is not greater than a target leakage, the POEC method with adjustable verification mechanism is not switched on and the method is done in Step 570.

Figure 7:
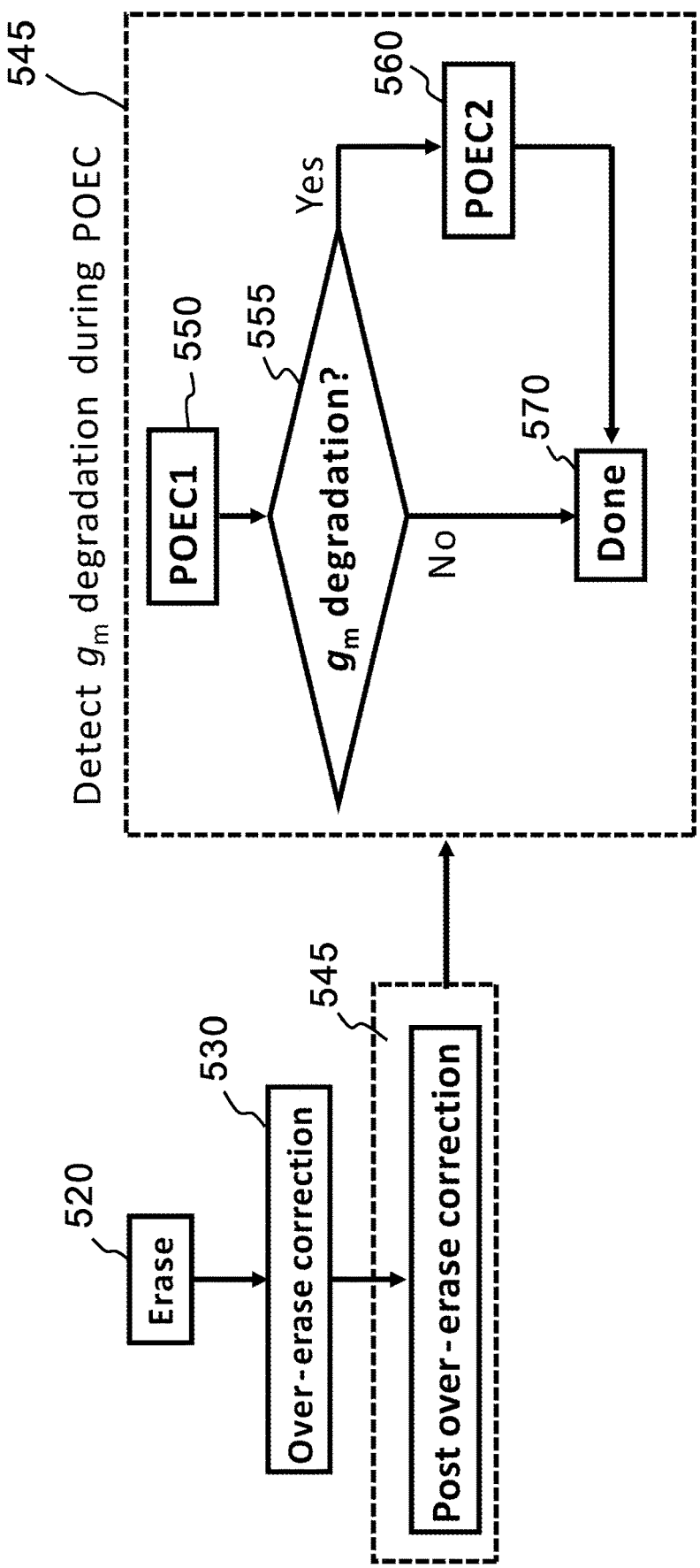
FIG. 7 is a flowchart illustrating a method for performing post over-erase correction when $g_m$ degradation is detected according to an embodiment of the present invention.

Refer to FIG. 7, which is a flowchart illustrating a method for performing post over-erase correction when $g_m$ degradation is detected according to an embodiment of the present invention.

The $g_m$ degradation of flash cells is detected during the first POEC mechanism operation or after the first POEC mechanism (POEC1) is finished. If $g_m$ degradation is detected, the POEC with adjustable verification mechanism (POEC2) is performed to further repair the Vt of flash cells to a higher level with or without adjusting the programming voltage of POEC.

The adjustable verification mechanism illustrated in FIG. 7 comprises the following. The reference current is produced by multiple sets of reference cells or constant current (REF1, REF2, REF3). Once the switching condition is reached, the number or amount of reference cells or constant current is reduced to lower the reference current.

In Step 520 the flash cells are erased and over-erase correction is performed in Step 530. In Step 545, the post over-erase correction mechanism is performed.

The POEC mechanism of Step 545 comprises performing the POEC with mechanism 1 (POEC1).

In Step 555, determine if there is $g_m$ degradation. If $g_m$ degradation is detected, switch on the POEC2 method and perform the POEC method with adjustable verification mechanism in Step 560. After performing the POEC2 method, the method is done in Step 570.

If $g_m$ degradation is not detected in Step 555, the POEC2 method is not switched on and the method is done in Step 570.

Figure 8:
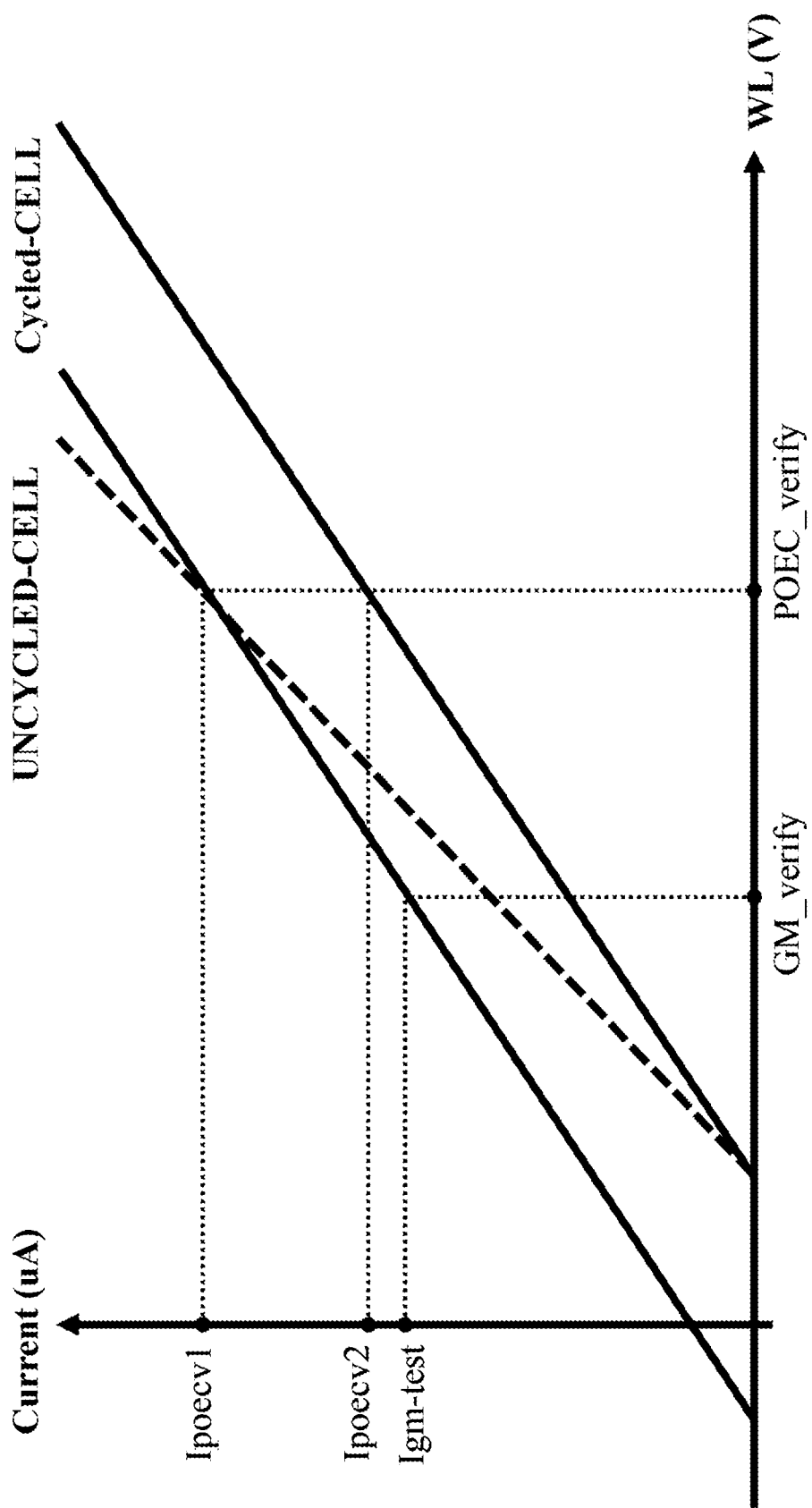
FIG. 8 is a graph illustrating detecting $g_m$ degradation according to an embodiment of the present invention.

Refer to FIG. 8, which is a graph illustrating detecting $g_m$ degradation according to an embodiment of the present invention. Initially, the post over-erase correction with mechanism 1 (POEC1) repairs cells with WL=POEC_verify and Iref=Ipoecv1 (For example, POEC_verify=3.5V, and Ipoecv1=10 uA). After that, WL and Iref are set to $g_m$_verify and I $g_m$-test, respectively, to detect $g_m$ degradation (For example, $g_m$_verify=3V, and I $g_m$-test=6.5 uA). Once the cell current is higher than I $g_m$-test, meaning that $g_m$ degradation occurs. When $g_m$ degradation occurs, the POEC method with adjustable verification mechanism (POEC method with mechanism 2, POEC2) repairs cells with different mechanisms. For example, Iref=Ipoecv2 and WL=POEC_verify or Iref=I $g_m$-test and WL=$g_m$_verify. The programming voltage (both WL and BL voltage) of POEC2 can be adjusted for preventing over soft-programming.

In the embodiment illustrated in FIG. 8, $g_m$ degradation is detected with WL=$g_m$-verify and Iref=I $g_m$-test.

Figure 9:
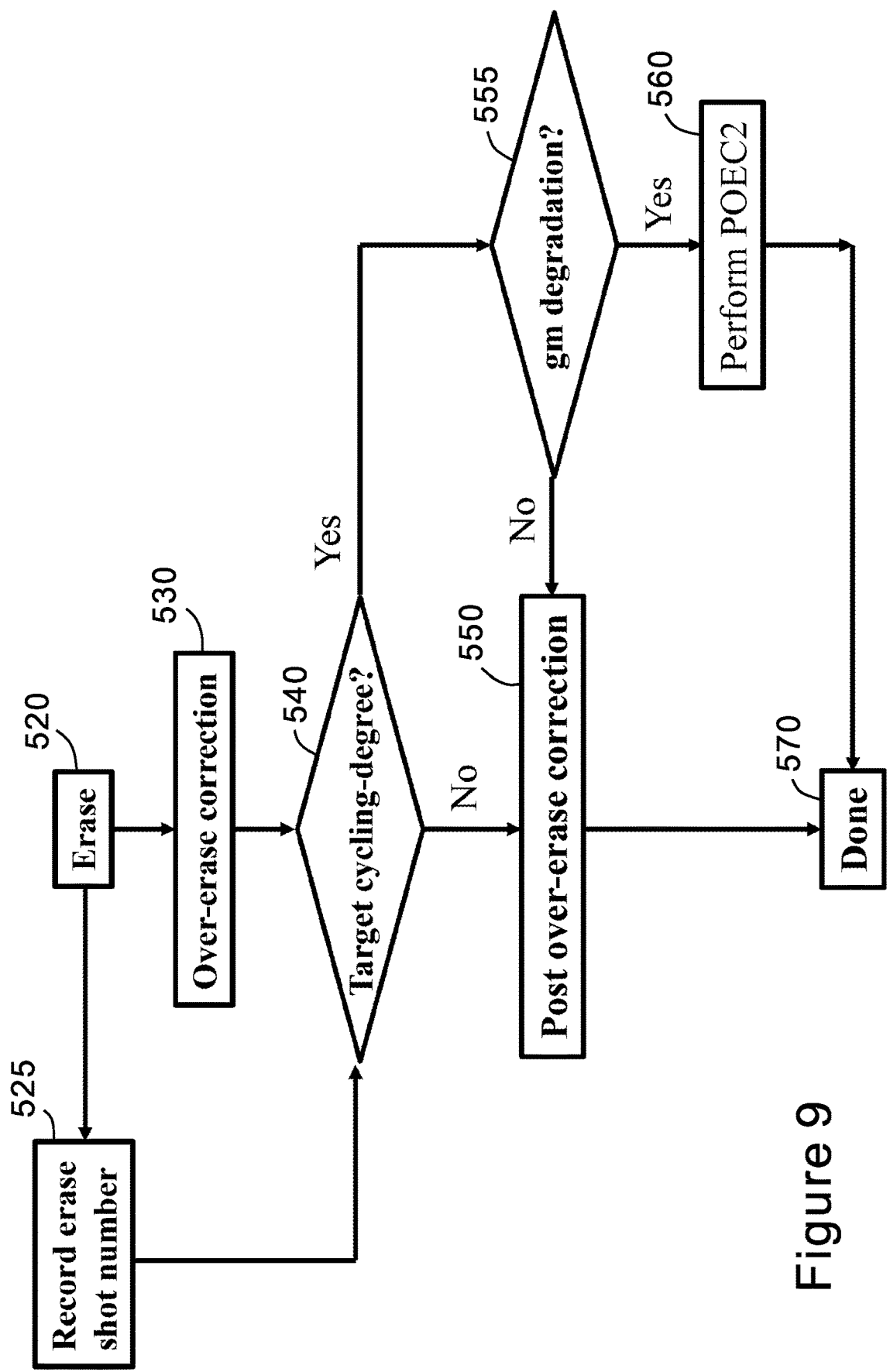
FIG. 9 is a flowchart illustrating determining the switching condition of the post over-ease correction mechanism according to an embodiment of the present invention.

Refer to FIG. 9, which is a flowchart illustrating determining the switching condition of the post over-ease correction mechanism according to an embodiment of the present invention.

Different combinations of the method of the present invention mentioned above are used to determine the switching condition of the POEC.

For example, the following conditions are used in various embodiments.

Consider only one of either the erase shot number, the repaired BL amount during OEC, the OEC shot number, the BL leakage current, or $g_m$ degradation.

Consider both the erase shot number and $g_m$ degradation, as shown in FIG. 9.

Consider both the repaired BL amount during OEC and $g_m$ degradation.

Consider both the OEC shot number and $g_m$ degradation.
Consider both the BL leakage current and $g_m$ degradation.

In the embodiment illustrated in FIG. 9, the switching condition of the POEC method considers both the erase shot number and $g_m$ degradation.

In Step 520 the flash cells are erased and over-erase correction is performed in Step 530. For each erase operation the erase shot number is recorded in Step 525. In Step 540 the erase shot number is used to determine whether or not the erase shot number has reached a target cycling-degree.

If the erase shot number has not reached a target cycling-degree, POEC1 is performed in Step 550 and the method is done in Step 570.

If the erase shot number has reached the target cycling-degree, in Step 555, determine if $g_m$ degradation is detected.

If $g_m$ degradation is detected in Step 555, switch on the POEC2 method and perform the POEC method with adjustable verification mechanism (POEC2) in Step 560.

If $g_m$ degradation is not detected in Step 555, do not switch on the POEC2 method and post over-erase correct is performed with mechanism 1 (POEC1). The After that, the method is done in Step 570.

Figure 10:
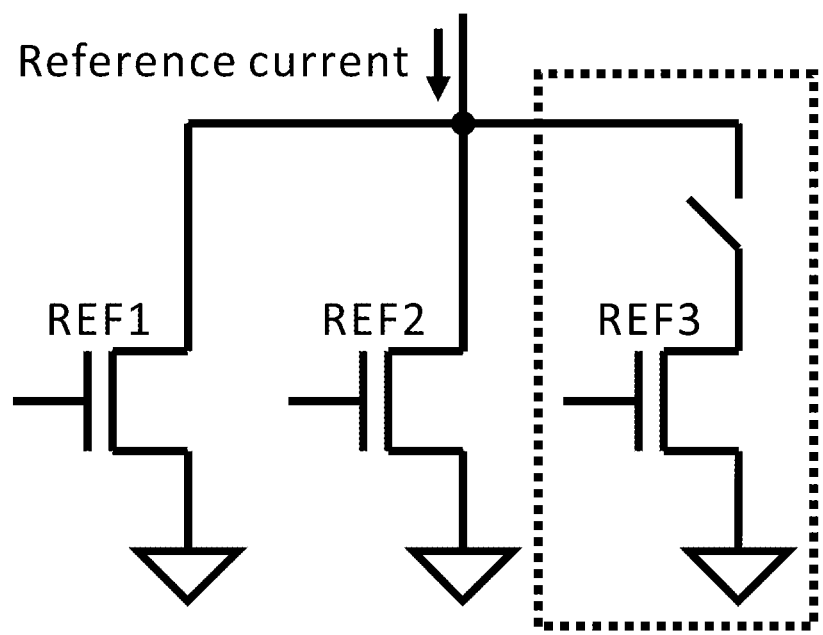
FIG. 10 is a diagram illustrating adjusting reference current to change a verification mechanism according to an embodiment of the present invention.

Refer to FIG. 10, which is a diagram illustrating adjusting reference current to change a verification mechanism according to an embodiment of the present invention.

As shown in FIG. 10, the reference current is produced by multiple sets of reference cells or constant current. Once the POEC switching condition is reached, the number of reference cells or constant current is reduced to lower the reference current.

Figure 11B:
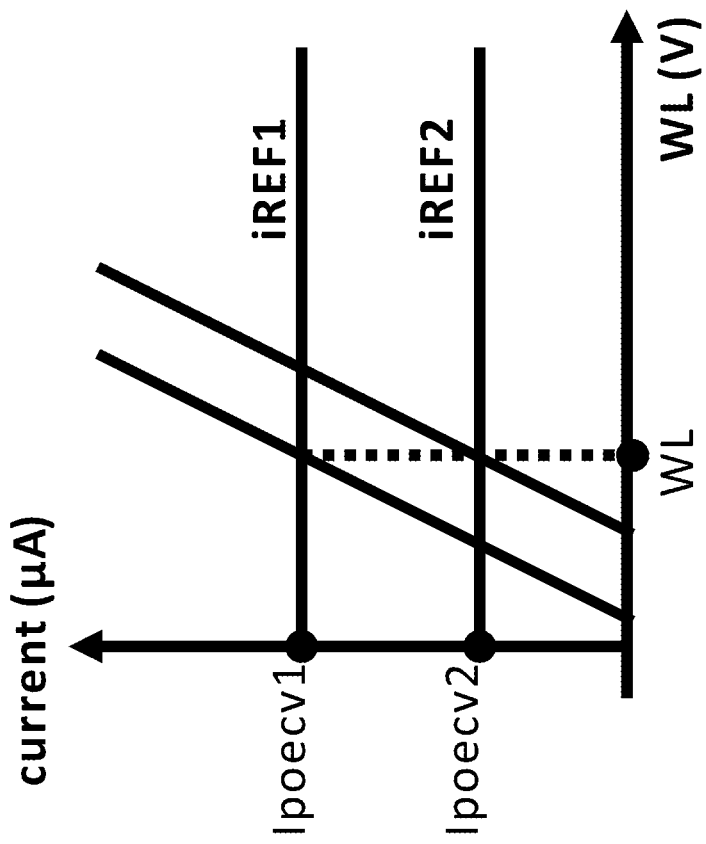
FIG. 11B is graph illustrating changing a comparison mechanism based on reference current according to an embodiment of the present invention.
Figure 11A:
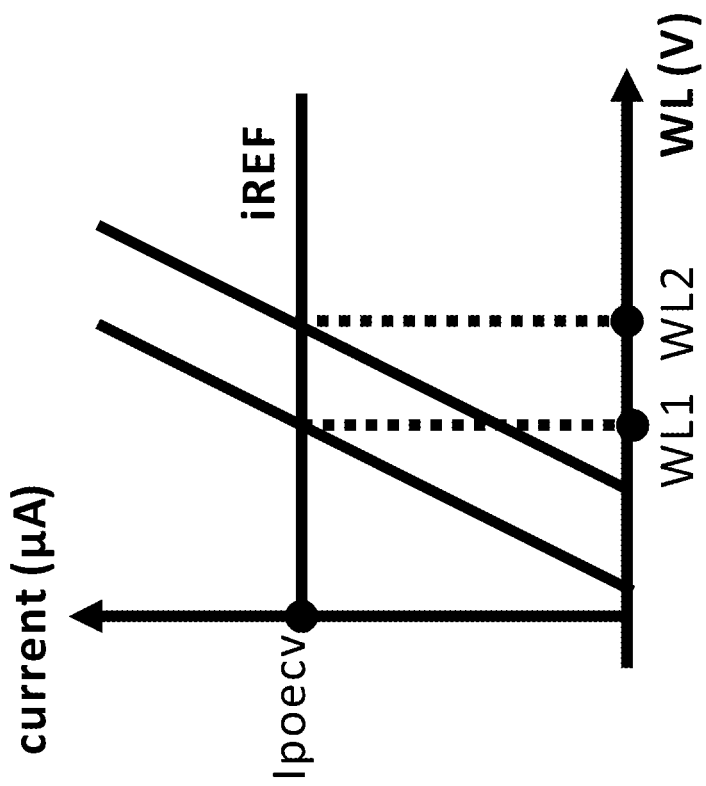
FIG. 11A is a graph illustrating changing a comparison mechanism based on word line voltage according to an embodiment of the present invention.

Two methods are used to change the verification mechanism of the POEC. Since the reference current is established by reference cells or constant current, the current comparison mechanism can be changed by modulating word line (WL) voltage or the reference current, as shown in FIG. 11A and FIG. 11B, respectively. When the preset cycling-degree is detected, the comparison condition is changed to repair the threshold voltage of over-erased cells to a higher level.

While the present disclosure has been described by means of specific embodiments, numerous modifications and variations could be made thereto by those skilled in the art without departing from the scope and spirit of the present disclosure set forth in the claims.

What is claimed is:

1. A post over-erase correction method with an auto-adjusting verification mechanism and a leakage degree detection function comprising:
    programming a plurality of flash cells;
    erasing the plurality of flash cells;
    performing over-erase correction;
    determining a target degree to obtain a switch condition result; and
    turning on the auto-adjusting verification mechanism and performing post over-erase correction based upon the switch condition result;
        wherein determining the target degree to obtain a switch condition result considers $g_m$ degradation.

2. The post over-erase correction method with an auto-adjusting verification mechanism and a leakage degree detection function according to claim 1, wherein reference current is produced by multiple sets of reference cells or constant current and turning on the auto-adjusting verification mechanism reduces an amount of reference cells or constant current to lower reference current.

3. The post over-erase correction method with an auto-adjusting verification mechanism and a leakage degree detection function according to claim 1, turning on the auto-adjusting verification mechanism and performing post over-erase correction repairs threshold voltage of over-erased cells to a higher level with or without adjusting power over-erase correction programming voltage.

4. The post over-erase correction method with an auto-adjusting verification mechanism and a leakage degree detection function according to claim 1, further comprising:
    recording an erase shot number for each erase procedure.

5. The post over-erase correction method with an auto-adjusting verification mechanism and a leakage degree detection function according to claim 4, further comprising:
    comparing the erase shot number with a target cycling-degree to confirm that the erase shot number has reached a target cycling-degree.

6. The post over-erase correction method with an auto-adjusting verification mechanism and a leakage degree detection function according to claim 5, wherein the switch condition result is a switch on condition when the erase shot number has reached the target cycling-degree.

7. The post over-erase correction method with an auto-adjusting verification mechanism and a leakage degree detection function according to claim 6, wherein the switch on condition turns on the auto-adjusting verification mechanism and the post over-erase correction is performed.

* * * * *